(12) United States Patent
Wallace

(10) Patent No.: US 7,448,013 B2
(45) Date of Patent: Nov. 4, 2008

(54) METHOD AND APPARATUS FOR FACILITATING CIRCUIT DESIGN

(75) Inventor: Andrew P. Wallace, Bristol (GB)

(73) Assignee: Broadcom Corporation, Irvine, CA (US)

( * ) Notice: Subject to any disclaimer, the term of this patent is extended or adjusted under 35 U.S.C. 154(b) by 321 days.

(21) Appl. No.: 11/023,357

(22) Filed: Dec. 29, 2004

(65) Prior Publication Data

US 2005/0114817 A1    May 26, 2005

Related U.S. Application Data

(63) Continuation of application No. 10/252,047, filed on Sep. 23, 2002, now Pat. No. 6,839,886.

(60) Provisional application No. 60/324,045, filed on Sep. 24, 2001.

(51) Int. Cl.
    *G06F 17/50*     (2006.01)
(52) U.S. Cl. .......................................... 716/11; 716/10
(58) Field of Classification Search ................ 716/8–12
See application file for complete search history.

(56) References Cited

U.S. PATENT DOCUMENTS

| | | | | |
|---|---|---|---|---|
| 5,173,864 A | * | 12/1992 | Watanabe et al. | 716/6 |
| 6,510,549 B1 | * | 1/2003 | Okamura | 716/17 |
| 6,625,787 B1 | * | 9/2003 | Baxter et al. | 716/6 |
| 6,839,886 B2 | * | 1/2005 | Wallace | 716/10 |
| 6,872,601 B1 | * | 3/2005 | Baxter et al. | 438/129 |
| 6,925,622 B2 | * | 8/2005 | Reyes | 716/6 |
| 7,275,232 B2 | * | 9/2007 | Schleicher et al. | 716/16 |

* cited by examiner

*Primary Examiner*—Thuan V. Do
*Assistant Examiner*—Binh C Tat
(74) *Attorney, Agent, or Firm*—Sterne, Kessler, Goldstein & Fox, P.L.L.C.

(57) ABSTRACT

There is disclosed a system for designing circuits which involves pre-placing delay elements between circuit components susceptible to shoot-through due to effects of clock skew, each delay element having a physical form and at least one input terminal and at least one output terminal; determining which delay elements are not critical in preventing shoot-through; removing non-critical delay elements from the circuit; and replacing each removed delay element with a cell having a physical form equivalent to the physical form of the removed delay element and a wire connection between an input and an output of the cell equivalent to an input and output of the delay element. This wire cell has the effect of removing the delay element from the circuit without having to reposition the circuit components. This has the result that it is not necessary to re-position circuit components on the removal of delay elements and then to re-evaluate the circuit performance. Circuit design can be significantly improved.

16 Claims, 4 Drawing Sheets

METHOD AND APPARATUS FOR FACILITATING CIRCUIT DESIGN

CROSS-REFERENCE TO RELATED APPLICATION

This application is a continuation of U.S. application Ser. No. 10/252,047, titled, "Method and Apparatus for Facilitating Circuit Design," filed Sep. 23, 2002, now issued as U.S. Pat. No. 6,839,886, which claims the benefit of U.S. Provisional Application No. 60/324,045, filed Sep. 24, 2001, both of which are herein incorporated by reference in their entireties.

FIELD OF THE INVENTION

The present invention relates to a method and apparatus for designing electronic circuits and to a circuit component.

BACKGROUND OF THE INVENTION

The production of electronic circuits, for example VLSI circuits, involves a design flow where the electronic function is first written in a logic form on a suitable software platform, then converted to logic gates by synthesiser software. Thereafter, the circuit design flow incorporates a physical design phase using an automatic place and route tool. The resulting circuit design is then analysed for performance.

One of the prime considerations is clock skew effects, caused by slow clock rise times which may cause shoot-through problems if gate switching is too fast. Thus, any circuit which is designed must be tested to ensure that it meets the timing requirements (constraints) at the extremes of operating conditions, that is for both fastest and slowest silicon performance. The paths between state elements of the circuit cannot have too short a delay but also cannot have too long a delay.

Traditionally, the problem of too short a delay, which could result in shoot-through, has been solved after design of the circuit by placing delay elements between the shoot-through sensitive circuit components and then re-placing and re-routing the circuit components in a further physical design step. The insertion of delay elements into the already designed circuit can be difficult if the circuit is congested.

An alternative is to pre-place delay cells as the circuit is designed in the physical design phase. This reduces the component placing problems in a complex circuit and therefore congestion because the delay elements are taken into account at the start of the design procedure. Moreover, problems caused by clock skew are substantially eliminated. However, this approach can be detrimental in terms of worst case timing so it is then important to determine which pre-placed delay elements are indeed necessary to prevent shoot-through. Those delay elements which can be removed from the circuit are so removed, with the result that the remaining components must then be re-positioned to take into account the gap left by the removed delay elements. The re-positioning of the components necessitates re-evaluation of the circuit for shoot-through.

Such re-placing and routing of a complex VLSI design can take many days to complete in computing time and re-analysis of the results.

SUMMARY OF THE INVENTION

The present invention seeks to provide improved circuit design.

According to an aspect of the present invention, there is provided a method of designing a circuit, including the steps of:
pre-placing delay elements between circuit components susceptible to shoot-through, each delay element representing a physical form, comprising at least one input terminal and at least one output terminal;
determining which delay elements are not critical in preventing shoot-through;
removing non-critical delay elements from the circuit; and
replacing a removed delay element with a conductor located between the positions of the input and output of the delay element.

The placement of a conductor between the input and output locations of the delay element means that the delay element can be removed from the circuit without having to reposition the other components or to re-evaluate the performance of the circuit.

The conductor is preferably a wire.

Advantageously, each removed delay element is replaced by a cell representing a physical form equivalent to the physical form of the removed delay element and a wire connection between an input and an output of the cell equivalent to an input and output of the delay element.

The replacement cell, called herein a wire cell, can be handled in automatic assembly in the same manner as the delay cell, with the result that there is no need for extensive reprogramming of the assembly tools.

Circuit design can be significantly improved by the invention.

According to another aspect of the present invention, there is provided computer apparatus for designing a circuit, including:
means for pre-placing delay elements between circuit components susceptible to shoot-through, each delay element representing a physical form and comprising at least one input terminal and at least one output terminal;
means for determining which delay elements are not critical in preventing shoot-through;
means for removing non-critical delay elements from the circuit; and
means for replacing a removed delay element with a conductor located between the positions of the input and output of the delay element.

The conductor may be a wire.

Advantageously, the replacing means is operable to replace each removed delay element by a cell representing a physical form equivalent to the physical form of the removed delay element and a wire connection between an input and an output of the cell equivalent to an input and output of the delay element.

The means may be in hardware or in software form.

According to another aspect of the present invention, there is provided a computer program for designing a circuit, including:
a procedure for placing components in a simulated circuit and designed to pre-place delay elements between circuit components susceptible to shoot-through, each delay element representing a physical form and comprising at least one input terminal and at least one output terminal;
a procedure for determining which delay elements are not critical in preventing shoot-through;
a procedure for removing non-critical delay elements from the circuit; and
a procedure for replacing in the simulated circuit a removed delay element with a conductor located between the positions of the input and output of the delay element.

The replacing procedure may replace each removed delay element with a wire.

Advantageously, the replacing procedure replaces each removed delay element with a cell having a physical form equivalent to the physical form of the removed delay element and a wire connection between an input and an output of the cell equivalent to an input and output of the delay element.

According to another aspect of the present invention, there is provided a wire cell for use as a replacement to a delay cell representing a physical form and comprising at least one input terminal and at least one output terminal, the wire cell representing a physical form equivalent to the physical form of the delay cell and a wire connection between an input and an output of the cell equivalent to an input and output of the delay cell.

The term circuit component used herein is intended to refer to state elements, logic elements and any other circuit components other than a delay element which are susceptible to shoot-through as a result of clock skew.

DESCRIPTION OF THE DRAWINGS

An embodiment of the present invention is described below, by way of example only, with reference to the accompanying drawings, in which.

DESCRIPTION OF THE PREFERRED EMBODIMENT

Figure 1:
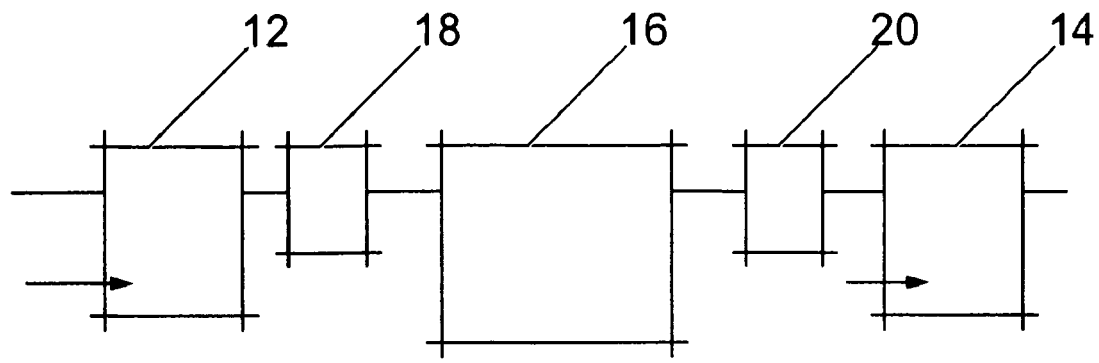
FIG. 1 is a schematic diagram of an example of part of an electronic circuit.

Referring to FIG. 1, there are shown a few circuit components which may typically be found in a VLSI circuit. In this example, there are two state elements 12, 14, which may be flip-flops, and a logic element 16. One of the state elements 12 is connected to the input of the logic element 16, while the other state element 14 is connected to the output of the logic element 16.

In order to avoid any shoot-through caused by clock skew, during the physical design phase of the circuit of FIG. 1, delay elements 18, 20 are pre-placed between those circuit elements which may be susceptible to shoot-through, in this case between the components 12 and 14 and the components 14 and 16. It is ensured that the delay elements meet worst case conditions so that it is not necessary to introduce any additional delay elements during the design process.

In some instances, twice the expected necessary delay is introduced such that even if those delay cells were removed they would still meet operating constraints. More specifically, suppose the cycle time of a circuit is c (the maximum time allowed for logic propagation between state elements) and the delay through a delay cell is d. Assuming the delay cells are unnecessary, the time taken in logic element 16 of FIG. 1 can be between 0 and c. The circuit synthesiser knows of the constraint of cycle time c. However, as the delay cells are present during synthesis, the synthesiser is told that the cycle time is c+2d, so that the time allowed in the logic is c and the time consumed by the two delay cells is 2d. Should the effects of clock skew mean that there cannot be a path of less than 2d (which is always by design a lot less than the cycle time) and the actual time used by the logic is t, the delay cells can be removed on paths where t>2d.

If there are paths coming either from the external inputs or to the external outputs, these paths will only see one delay element and an external time constraint of e. The synthesiser is the told the time allowed for the path is t+d−e. In other words, the external logic reduced the time allowed.

Figure 2:
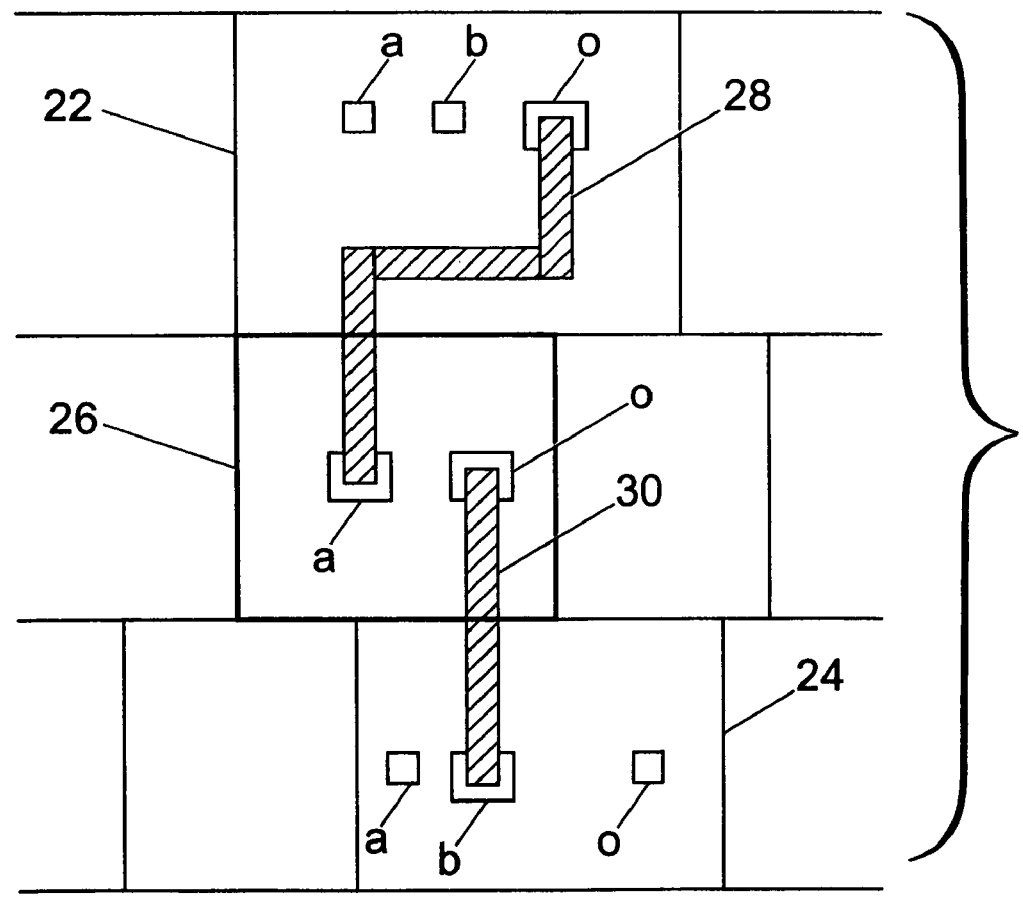
FIG. 2 is a plan view of two state elements coupled together through a delay element.

FIG. 2 shows an example of a component lay-out suitable for the circuit of FIG. 1. This type of layout is determined (and can be manipulated) in the physical design phase of circuit design. In this example, there are provided first and second cells 22, 24, between which there is provided a delay cell 26. Considering the circuit of FIG. 1, the cells 22, 24 may constitute, for example, the state element 12 and logic element 16 and the delay cell 26 would constitute the delay element 18.

The cell 22 has first and second inputs a,b and an output o which is to be connected to input b of the cell 24. The design process automatically pre-places delay cell 26 between the two cells 22,24, which is connected between the output o of cell 22 and input b of cell 24. In practice, the delay cell 26 has a particular physical shape and size and also specific input and output terminals or pins a and o.

FIG. 2 also shows representations of the metal interconnects which would be provided on the board itself, in this case there being a metal interconnect 28 coupling output o of cell 22 to input a of delay cell 26, and an interconnect 30 between output o of delay cell 26 and input a of cell 24.

It can be seen from FIG. 2 that the cells 22-26 have predetermined physical forms and terminal positions which determine their location on the circuit board.

The process of determining the component lay-out is typically carried out by computer with suitable simulation software. This then determines the control routine for automatic circuit assembly.

Once the circuit has been designed and the components placed and routed onto a circuit board in the normal manner, the circuit is analysed using conventional methods and additionally to determine which delay cells are necessary and which can be removed. In practice, simulation software examines each delay in turn to see what the effect is of removing it and of connecting directly together the two cells either side of the delay cell.

Take for example a case where the delay 26, having been added speculatively, is determined not to be necessary. In the prior art it would have been necessary to change the positions of the cells 22 and 24 and to change the routing of the interconnects 28, 30. These changes will affect the timing performance of the circuit, which therefore requires re-evaluation. Filler elements used for filling the gap and preserving power lines are known but they do not deal with the problems of re-routing and necessary re-evaluation.

Figure 3:
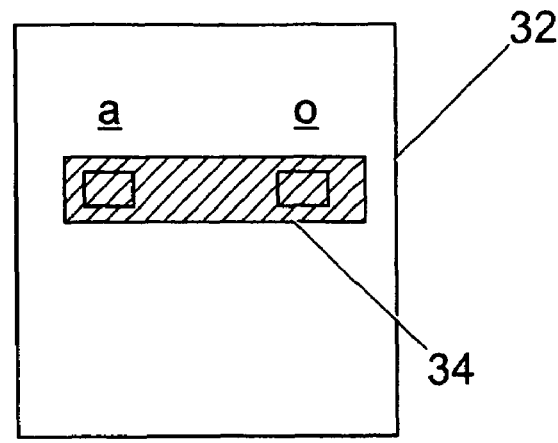
FIG. 3 is a schematic diagram of an embodiment of a wire cell.

FIG. 3 shows an embodiment of wire cell 32 for use as a replacement to the delay cell 26 of the example of FIG. 2. The wire cell 32 has the same physical form as the delay cell 26, that is it has the same size and shape of casing as the delay cell 26 and terminals a and o at the same locations as the terminals a and o of the delay cell 26. The wire cell has a wire 34 therein which connects together its terminals a and o.

Figure 4:
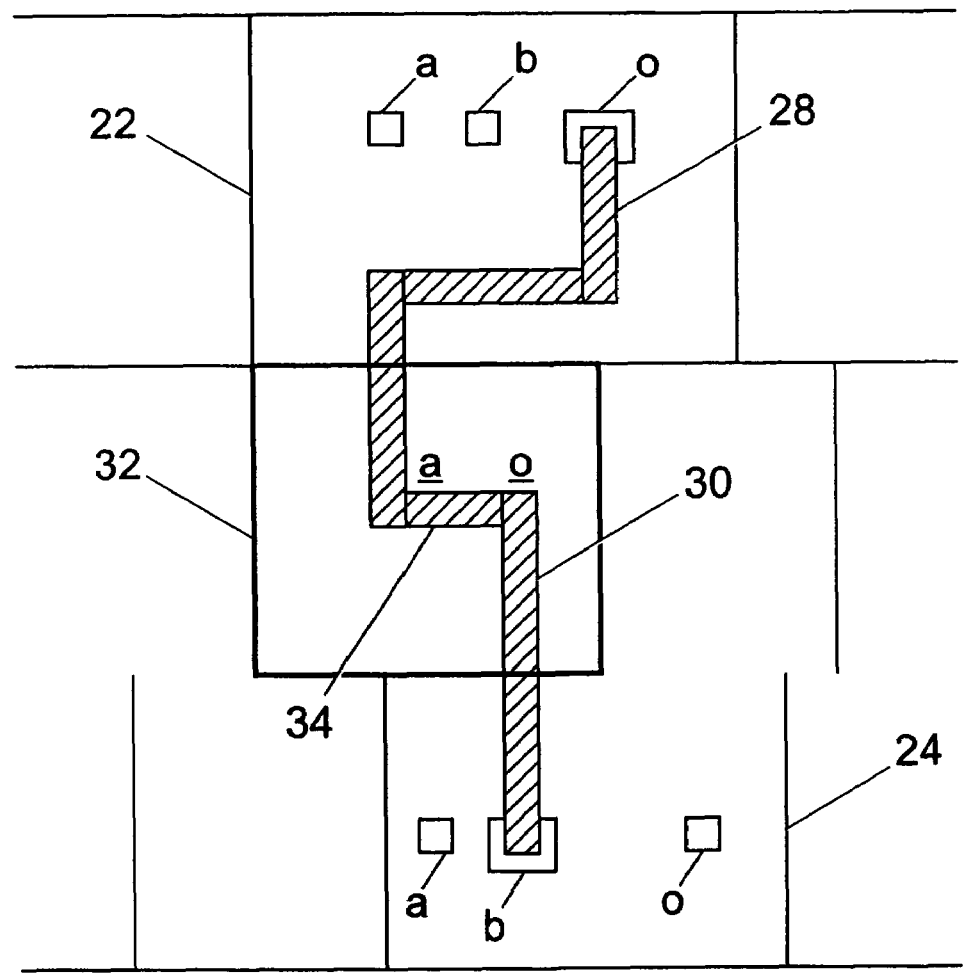
FIG. 4 shows the circuit of FIG. 2 in which the delay element is replaced by the wire cell of FIG. 3.

Referring now to FIG. 4, the circuit of FIG. 2 can be seen with the delay cell 26 replaced by the wire cell 32. The wire cell 32 fits precisely in the location of the delay cell 26 and its wire 34 connects the interconnects 28 and 30 previously provided without the need for any re-routing, in practice shorting them together.

It will be noticed that the wire cell 32 has the same cell library as the delay cell 26 to ensure that it can be handled during automated assembly in exactly the same manner as the delay cell 26. There is no need for reprogramming apart from identification of the location of the replacement wire cells in the assembly process, which is simply a text file change.

Figure 5:
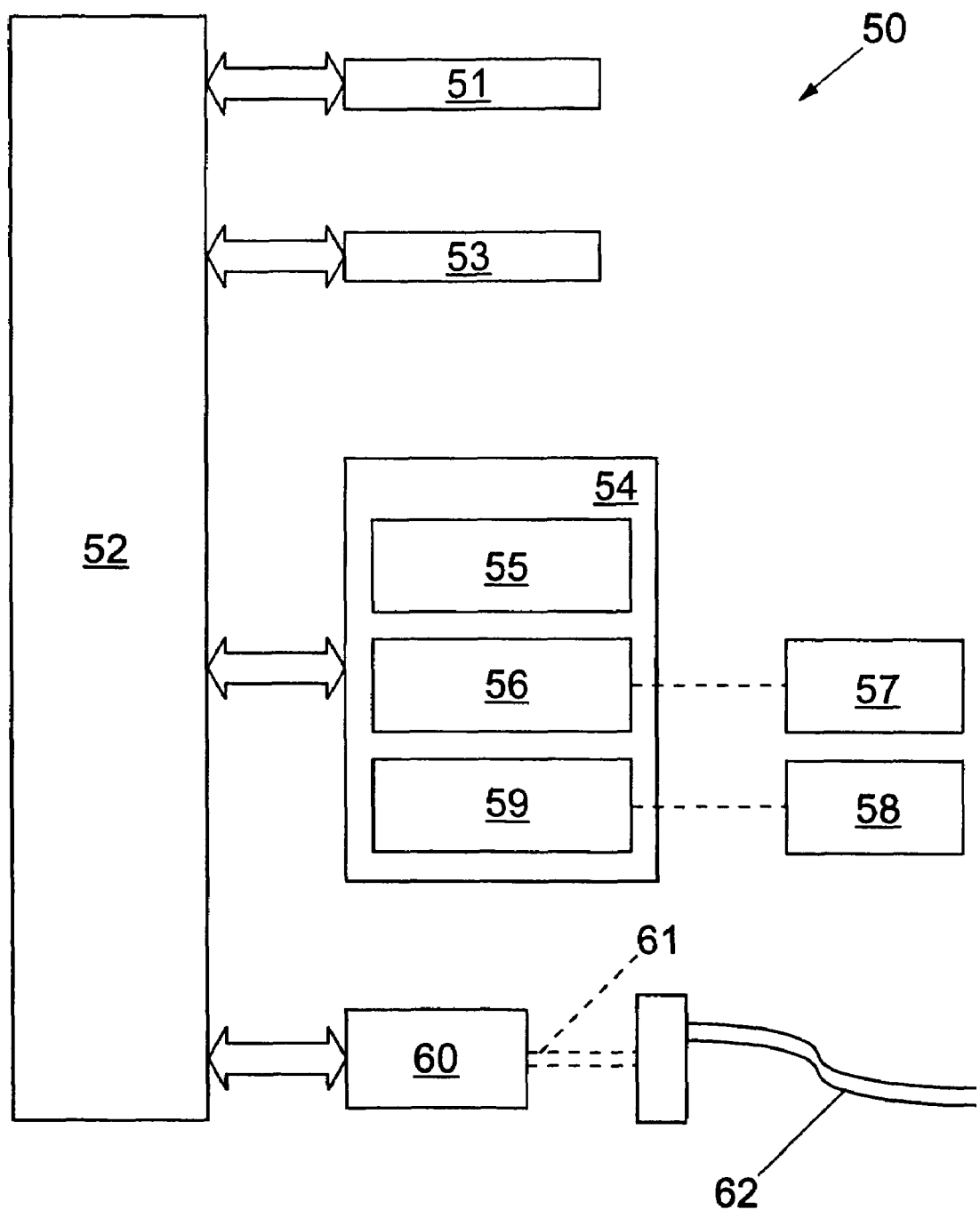
FIG. 5 is an exemplary computer system that can perform the circuit design method described herein.

FIG. 5 illustrates an example computer system 50, in which the present invention can be implemented as computer-readable code. Various embodiments of the invention are described in terms of this example computer system 50. After reading this description, it will become apparent to a person skilled in the relevant art how to implement the invention using other computer systems and/or computer architectures.

The computer system 50 includes one or more processors, such as processor 51. Processor 51 can be a special purpose or a general purpose digital signal processor. The processor 51 is connected to a communication infrastructure 52 (for example, a bus or network). Various software implementations are described in terms of this exemplary computer system. After reading this description, it will become apparent to a person skilled in the relevant art how to implement the invention using other computer systems and/or computer architectures.

Computer system 50 also includes a main memory 53, preferably random access memory (RAM), and may also include a secondary memory 54. The secondary memory 54 may include, for example, a hard disk drive 55 and/or a removable storage drive 56, representing a floppy disk drive, a magnetic tape drive, an optical disk drive, etc. The removable storage drive 56 reads from and/or writes to a removable storage unit 57 in a well known manner. Removable storage unit 57, represents a floppy disk, magnetic tape, optical disk, etc. which is read by and written to by removable storage drive 56. As will be appreciated, the removable storage unit 57 includes a computer usable storage medium having stored therein computer software and/or data.

In alternative implementations, secondary memory 54 may include other similar means for allowing computer programs or other instructions to be loaded into computer system 50. Such means may include, for example, a removable storage unit 58 and an interface 59. Examples of such means may include a program cartridge and cartridge interface, a removable memory chip (such as an EPROM, or PROM) and associated socket, and other removable storage units 58 and interfaces 59 which allow software and data to be transferred from the removable storage unit 58 to computer system 50.

Computer system 50 may also include a communications interface 60. Communications interface 60 allows software and data to be transferred between the computer system 50 and external devices. Examples of communications interface 60 may include a modem, a network interface (such as an Ethernet card), a communications port, a PCMCIA slot and card, etc. Software and data transferred via communications interface 60 are in the form of signals 61 which may be electronic, electromagnetic, optical or other signals capable of being received by communications interface 60. These signals 61 are provided to communications interface 60 via a communications path 62. Communications path 62 carries signals 61 and may be implemented using wire or cable, fiber optics, a phone line, a cellular phone link, an RF link and other communications channels.

In this document, the terms "computer program medium" and "computer usable medium" are used to generally refer to media such as removable storage drive 56, a hard disk installed in hard disk drive 55, and signals 61. Computer program medium and computer usable medium can also refer to memories, such as main memory 53 and secondary memory 54, that can be memory semiconductors (e.g. DRAMs, etc.) These computer program products are means for providing software to computer system 50.

Computer programs (also called computer control logic) are stored in main memory 53 and/or secondary memory 54. Computer programs may also be received via communications interface 60. Such computer programs, when executed, enable the computer system 50 to implement embodiments of the present invention as discussed herein. In particular, the computer programs, when executed, enable the processor 51 to implement the processes of the present invention, such as the circuit design method described generally by the flowchart of FIG. 6.

Accordingly, such computer programs represent controllers of the computer system 50. Where the invention is implemented using software, the software may be stored in a computer program product and loaded into computer system 50 using removable storage drive 56, hard drive 55 and/or communications interface 61.

Figure 6:
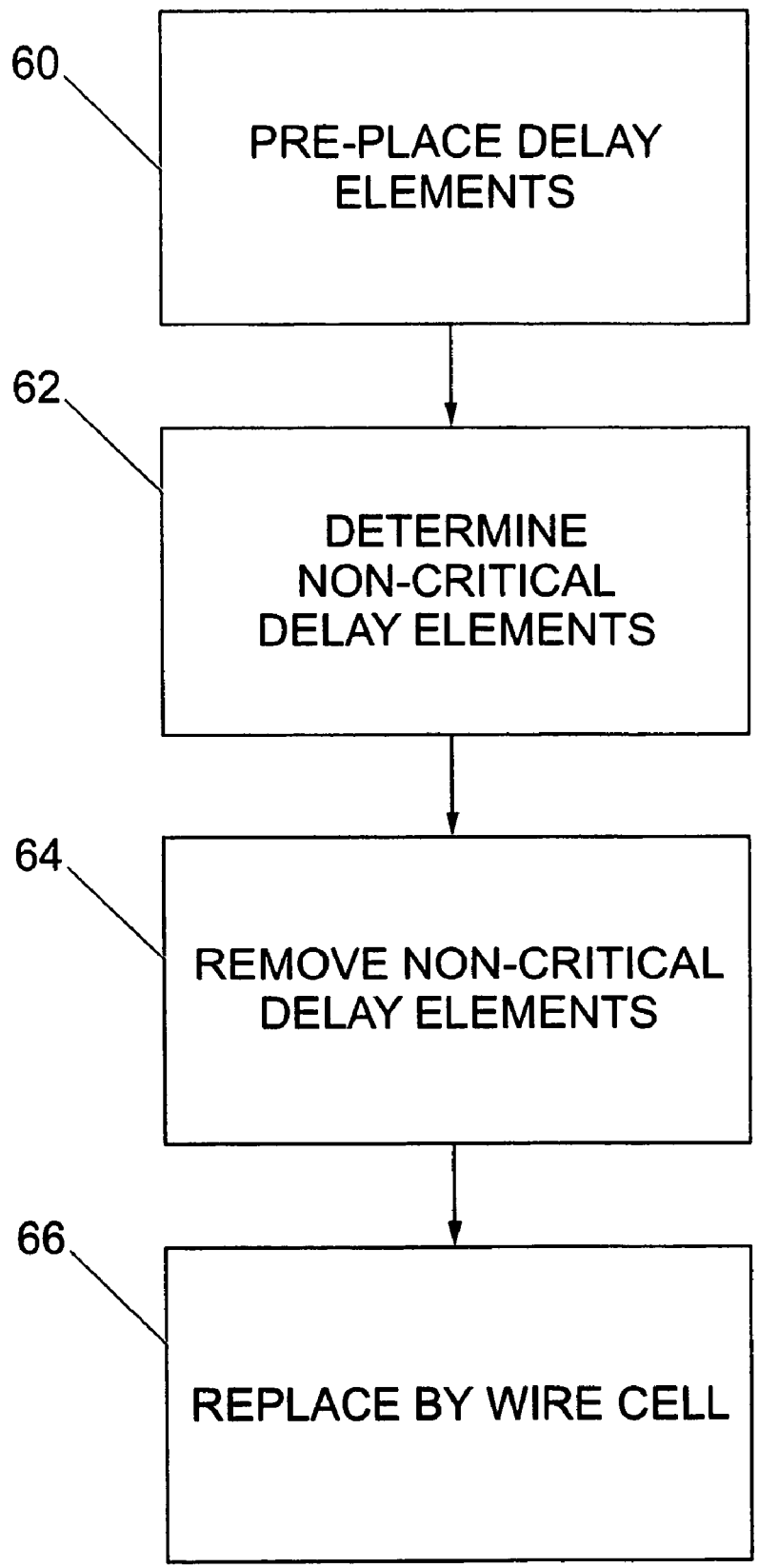
FIG. 6 is a flow chart showing the principal circuit design stages of the preferred embodiment.

FIG. 6 shows an example of the principal circuit design steps for the embodiments described herein. As explained above, these design steps are typically carried out by software as part of simulated synthesis.

At step 60, delay elements are pre-placed between logic elements of the circuit being designed. At step 62 the system determines which pre-placed delay elements are not critical to circuit operation. These non-critical delay elements are removed from the circuit in step 64 and replaced by their equivalent wire cells in step 66.

It will be apparent that in practice a variety of wire cells may be provided suitable for a variety of different delay cells in cases where such a variety is used. The ability to swap cells in this manner without re-routing saves a considerable amount of design time and hence cost.

Furthermore, the wire cell allows shoot-through problems to be solved without affecting worst case timing. It allows delay cells to be placed on every path at the beginning of the design process and to be easily removed. This ensures all paths are equally affected to ensure that there are no surprises during the design process, such as the inclusion of a delay cell on a critical path affecting worst case timing because the initial guess as to where to place delay cells was incorrect. The latter situation can occur with prior art methods where the temptation is to limit the number of delay cells introduced because of the difficulty of subsequently removing delay cells.

Moreover, the effect of wire cells is predictable and it is therefore not necessary to analyse timing again on replacement of delay cells with the wire cells.

In an alternative embodiment, the delay cell 26 can be replaced by a simple wire or by an equivalent interconnect.

While certain embodiments of the invention have been described it is to be understood that modifications will be readily apparent to the skilled person and that the invention should only be determined by the scope of the attached claims. For example, the advantages of the claimed invention apply to many different types of electronic circuits and preferred method steps can be implemented at any suitable stage in the circuit design flow.

I claim:

1. A method for designing a circuit, comprising the steps of:
   pre-placing delay elements between circuit components, each delay element comprising at least one input terminal and at least one output terminal;
   analyzing the circuit to identify non-critical delay elements that are not needed for circuit operation;

removing a non-critical delay element from the circuit; and replacing the removed delay element with a conductor located between positions of an input terminal and an output terminal of the removed delay element without changing said positions.

2. The method of claim 1, wherein the removed delay element is replaced by a wire.

3. The method of claim 1, wherein the removed delay element is replaced by a cell having a physical form equivalent to the physical form of the removed delay element and a wire connection between an input and an output of the cell equivalent to an input and an output of the delay element.

4. The method of claim 1, wherein the pre-placing, analyzing, removing and replacing steps are initially carried out in simulation.

5. Computer apparatus for designing a circuit, including:

means for pre-placing delay elements between components in a circuit layout, each delay element comprising at least one input terminal and at least one output terminal;

means for identifying non-critical delay elements that are not needed for circuit operation;

means for removing a non-critical delay element from the circuit; and means for replacing the removed delay element with a conductor located between positions of an input terminal and an output terminal of the removed delay element without changing said positions.

6. Apparatus according to claim 5, wherein said means for replacing replaces the removed delay element with a wire.

7. Apparatus according to claim 5, wherein said means for replacing replaces the removed delay element by a cell having a physical form equivalent to the physical form of the removed delay element and a wire connection between an input and an output of the cell equivalent to an input and an output of the delay element.

8. Apparatus according to claim 5, wherein said means for pre-placing, said means for identifying, said means for removing, and said means for replacing are in hardware form.

9. Apparatus according to claim 5, wherein said means for pre-placing, said means for identifying, said means for removing, and said means for replacing are in software form.

10. A computer program product comprising a computer usable medium having executable code to execute a process for designing a circuit, the process comprising:

pre-placing delay elements between circuit components, each delay element comprising at least one input terminal and at least one output terminal;

identifying non-critical delay elements that are not needed for circuit operation;

removing a non-critical delay element from the circuit; and replacing the removed delay element with a conductor located between positions of an input terminal and an output terminal of the removed delay element without changing said positions.

11. A computer program product according to claim 10, wherein the removed delay element is replaced by a wire.

12. A computer program product according to claim 10, wherein the removed delay element is replaced by a cell having a physical form equivalent to a physical form of the removed delay element and a wire connection between an input and an output of the cell equivalent to an input and an output of the delay element.

13. A computer program product according to claim 10, wherein the program is stored in a physical memory or other computer readable medium.

14. A method of designing a circuit, including the steps of:

pre-placing delay elements between circuit components, each delay element comprising at least one input terminal and at least one output terminal;

identifying non-critical delay elements that are not needed for circuit operation;

removing a non-critical delay element from the circuit; and replacing the removed delay element with a cell having a physical form equivalent to a physical form of the removed delay element and a wire connection between an input and an output of the cell in the same position as an input and an output of the removed delay element.

15. Apparatus for designing a circuit, including;

means for pre-placing delay elements between circuit components, each delay element representing a physical form and comprising at least one input terminal and at least one output terminal;

means for identifying non-critical delay elements that are not needed for circuit operation;

means for removing non-critical delay element from the circuit; and means for replacing the removed delay element with a cell having a physical form equivalent to the physical form of the removed delay element and a wire connection between an input and an output of the cell in the same position as an input and an output of the delay element.

16. A computer program product comprising a computer usable medium having executable code to execute a process for designing a circuit, the process comprising:

pre-placing delay elements between circuit components, each delay element representing a physical form and comprising at least one input terminal and at least one output terminal;

identifying non-critical delay elements that are not needed for circuit operation;

removing a non-critical delay element from the circuit; and replacing the removed delay element with a cell having a physical form equivalent to the physical form of the removed delay element and a wire connection between an input and an output of the cell in the same position as an input and an output of the delay element.

* * * * *